United States Patent [19]

DeMunda et al.

[11] Patent Number: 4,596,716

[45] Date of Patent: Jun. 24, 1986

[54] POROUS SILICON NITRIDE SEMICONDUCTOR DOPANT CARRIERS

[75] Inventors: Gabriel P. DeMunda, Niagara Falls, N.Y.; Richard E. Tressler, Julian, Pa.

[73] Assignee: Kennecott Corporation, Cleveland, Ohio

[21] Appl. No.: 502,286

[22] Filed: Jun. 8, 1983

[51] Int. Cl.⁴ .............................................. B05D 5/00
[52] U.S. Cl. .................................. 427/243; 148/189; 252/951
[58] Field of Search ................. 427/85, 243; 118/900; 148/189; 252/950, 951; 264/60, 63; 501/97

[56] References Cited

U.S. PATENT DOCUMENTS 3,839,540 10/1974 Arrol ...................................... 501/97
3,849,344 11/1974 McMartry et al. ............. 252/951 X
3,923,563 12/1975 Venkata ......................... 252/951 X

*Primary Examiner*—Norman Morgenstern
*Assistant Examiner*—K. Jaconetty
*Attorney, Agent, or Firm*—Harold M. Snyder; R. Lawrence Sahr; David M. Ronyak

[57] ABSTRACT

New porous semiconductor dopant carriers are disclosed together with a method for the diffusion doping of semiconductors by the vapor phase transport of an n or p type dopants, such as phosphorus, arsenic, antimony, boron, gallium, aluminum, zinc, silicon, tellurium, tin and cadmium to the semiconductor host substrate; wherein the dopant source comprises a dopant containing porous, inert, rigid dimensionally stable and thermal shock resistant reaction sintered $Si_3N_4$ carrier material.

2 Claims, No Drawings

POROUS SILICON NITRIDE SEMICONDUCTOR DOPANT CARRIERS

FIELD OF INVENTION

This invention relates to novel porous, inert, rigid, dimensionally stable and thermal shock resistant, vapor diffusion $Si_3N_4$ containing dopant carriers, to methods of providing such carriers, to diffusion sources containing said carriers and to a method for diffusion doping semiconductors utilizing $Si_3N_4$ containing carriers.

BACKGROUND OF THE INVENTION

Semiconductor elements have multiple applications and utility in the electronics industry and are used in rectifiers, transistors, photodiodes, solar batteries, radiation detectors, charged particle detectors, integrated circuits and various other applications. They have been known in the industry for many years and the term semi-conductor element is generally accepted throughout the industry and intended in this application to generically include semiconductor devices and parts thereof formed of host substrates comprising elements, alloys and intermetallic compounds of silicon, germanium, silicon/germanium, gallium arsenide, indium phosphide and the like. Such semiconductor elements can be of any convenient or suitable shape or form but are typically commercially used in the form of circular, rectangular or triangular wafers or disks.

In order to achieve the various electrical rectification characteristics so important to their multiple applications and utilities, semiconductor elements typically have an active impurity incorporated within the host substrate, during manufacture or later by diffusion, which impurity affects the electrical rectification characteristics of the semiconductor element. These active impurities are usually classified as donor impurities or acceptor impurities; the donor impurities including phosphorus, arsenic, antimony, silicon, tellurium, tin, and the like; and, the acceptor impurities including boron, gallium, aluminum, zinc, cadmium and the like.

The semiconductor element may have a region thereof containing an excess of donor impurities thus yielding an excess of free electrons. Such region is termed an impurity doped ntype region. Similarly, the semiconductor element may have a region thereof containing an excess of acceptor impurities, which results in a deficit of electrons, such region being termed an impurity doped p-type region. The boundary between such p-type and n-type regions is termed the n-p or p-n junction. In many applications the uniformity of the impurity distribution within the p or n type region, as well as the sharpness of the p-n or n-p junction, is critical to the efficiency of the semiconductor element.

Multiple means have been proposed for incorporating various active impurities in the semiconductor element. Typically, the active impurity may be intimately incorporated during preparation of the host substrate or may be incorporated by deposition on the host substrate during manufacture.

DESCRIPTION OF THE PRIOR ART

The deposition of active impurities at the surface of the semiconductor host substrate during manufacture typically comprises the high temperature diffusion of vaporized dopant atoms into the body of the host substrate. Typically the diffusion of the doping substance into the host substrate is achieved by heating a predetermined quantity of dopant, together with the host substrate in a closed receptacle in such manner that dopant atoms will permeate the semiconductor body from all or select sides. One method involving deposition of dopants on a limited surface of a semiconductor element is described in U.S. Pat. No. 3,287,187 wherein an oxide of the host substrate material is deposited on the host substrate followed by diffusion of the doping substance into the substrate surface area by heating the host substrate.

U.S. Pat. No. 3,923,563 depicts a typical method of deposition and diffusion wherein porous, rigid dimensionally stable wafers are formed by compacting and sintering refractory oxide powders. The thus formed wafers are then impregnated with aluminum metaphosphate, arsenic oxide or antimony oxide by treatment with solutions thereof in suitable organic or aqueous solvents. These wafers function as the source of dopant vapors and are positioned in a suitable furnace in the vicinity of the host substrate. The dopant wafer and host substrate are heated to temperatures between about 850° C. to about 1250° C. wherein the dopant wafer liberates phosphorus, arsenic or antimony oxide vapors which pass through the furnace and contact the host substrate. The vapors appear to react with the hot silicon surface and the elemental phosphorus, arsenic and/or antimony diffuse into the host substrate with continued heating to create the semiconductor element.

U.S. Pat. No. 3,920,882 discloses a solid dopant source comprising a porous, inert, rigid, dimensionally stable, refractory support impregnated with a dopant component. The porous supports are formed by compacting and sintering refractory oxide powders such as stabilized zirconia powder, alumina powders, silica powders, thoria and the like; they are compacted, sintered and thereafter impregnated with a solution of the dopant component.

U.S. Pat. No. 3,849,344 discloses a solid dopant source comprising a hot pressed composition containing preferably about 70 wt percent silicon nitride and about 30 wt percent of a phosphorus/silicon compound. The patent describes the hot pressing technique as resulting in uniform composites composed of discrete particles of its components, held together by the plastic deformation of the particles. Suitable phosphorus/silicon compounds are described as the reaction products of phosphorus and silicon oxides. The patent does disclose that up to about 95 weight percent of the composition can be silicon nitride.

OBJECTS OF THE INVENTION

One object of the invention is to provide novel solid dopant carriers comprised of reaction sintered $Si_3N_4$.

Another object of the invention is to provide novel solid dopant sources comprising a dopant and a carrier containing reaction sintered $Si_3N_4$.

A further object of the invention is to provide methods for the preparation of dopant sources and dopant carriers containing reaction sintered $Si_3N_4$.

A still further object is to provide a method for the diffusion doping of semiconductor host substances by a dopant source comprising a dopant and a porous, inert, rigid non-oxide containing reaction sintered $Si_3N_4$ carrier material.

These and other objects will be apparent from the following description of the invention.

DESCRIPTION OF THE INVENTION

It has been discovered that solid dopant sources can be provided, which are capable of liberating active impurities at elevated temperatures and which are so dimensionally stable as to have substantially no deformation or slump while maintaining high thermal shock resistance, such sources being comprised of reaction sintered $Si_3N_4$. By reaction sintered $Si_3N_4$ is meant that elemental silicon particulate material is first formed to an appropriate solid dopant source configuration and is then, nitrided, at elevated temperatures, to cause at least some formation of $Si_3N_4$ together with bonding of either silicon nitride to silicon nitride or silicon nitride to elemental silicon.

The solid dopant carrier of the invention can be prepared by various means. One preferred means is to compact crushed particulated elemental silicon within an appropriate die to form an appropriate "green compact" of the desired configuration. The green compact is then fired for a time and at a temperature sufficient for sintering, in the presence of nitrogen, to yield the porous, dimensionally stable, reaction sintered $Si_3N_4$ dopant carrier of the invention.

Initially, particulate elemental silicon is selected having a particle size sufficient to yield a final sintered product having an appropriate porosity and pore size which is varied dependent upon the dopant which is sought to be carried. Generally, it is desirable to obtain a sintered carrier having a volume porosity of at least about 20% and preferably in the range of 40% to 80%. The pore size of the carrier is also critical in that they should not be so small as to significantly restrict the flow of dopant into the carrier. Typically, average pore size in the range of from about 5 microns to about 250 microns has been found appropriate for most dopants. Appropriate pore size can typically be achieved by utilizing particle sizes from about 1 micron to about 150 microns. Mixtures of elemental silicon with silicon nitride have been found effective for producing the desired reaction sintered product. In such instance mixtures containing up to about 75% by weight $Si_3N_4$ can be effectively reaction sintered to produce the desired product.

Compacting of the particulate compounds of this invention can act to achieve two purposes, firstly to form the "green compact" for sintering and secondly to achieve a convenient and suitable size and shape of the carrier. It should be understood that compacting is not a necessary element of this invention.

In many instances, it is desirable to hold the crushed particulate together by a binding means to expedite compacting and to assure appropriate porosity during sintering. Typical binders which have been found useful for molding the particulate compounds of the invention into suitable form include organic binders such as starches, dextrines, gums, flours, casein, gelatins, albumins, proteins, lignins, cellulosics, bitumens, rubbers, alginates, waxes and the like; synthetic resins such as vinyls, acrylics, wax emulsions, paraffin, cellulosics, glycols, epoxies, phenolics and the like; and inorganic binders such as silicates, colloidal silica, colloidal alumina, colloidal aluminates, colloidal silicates and the like.

In certain instances, various additive compounds may be included with the particulate compounds of the invention for purposes such as accelerating sintering or improving the mechanical or thermal strength of the moldings. In such instance, it is important that the amount and type of such additive compounds be controlled so that they do not adversely effect the dopant vaporization or contribute non-desirable diffusable impurities which adversely effect or otherwise undesirably influence the electrical properties of the semiconductor elements.

The additive compounds can be granular or fibrous in shape. Though not generally necessary, fibrous additives have been found effective in enhancing the thermal shock resistance of molded wafers. Granular decomposable additives have been found effective in increasing the porosity of the sintered wafers. It should be understood, however, that though various additives can be utilized in the practice of this invention, it has generally been found that the compounds themselves are so superior that further additives are unnecessary.

In the formation of solid dopant carriers the particulate elemental silicon is mixed with a binder as before described, with or without an appropriate additive, then molded or compacted into a suitable die. Compacting the compound/binder mixture is not necessary but in some instances may help form the particulate mixture to a desirable green density for sintering. The formed mixture can then be reaction sintered by heating in the presence of nitrogen to between about 1,000° and 1,800° C. until a porous, inert, rigid, $Si_3N_4$ containing structure is created.

During the sintering process, the surface of the carrier is subjected to a nitrogen atmosphere. The nitrogen can be in the form of a gas or nitrogen containing compound such as forming gas, ammonia, etc. Typically, the carrier is treated by a "static" system wherein the nitrogen is charged to the reactor furnace, however, it is preferred to use a flow system wherein nitrogen gas is caused to continually flow past the surface of the carrier. The nitrogen source present during the heating process causes the elemental silicon to be converted to $Si_3N_4$ which in turn effects the sintering process. The thus formed reaction sintered product was found to be porous, inert, rigid, dimensionally stable and thermal shock resistant.

The solid carrier can be formed in any convenient size and shape, but usually it is formed in substantially the same size and shape as the semiconductor element it will be doping. One advantage of the instant invention is that the starting compound may be molded, compacted and sintered into rods, billets, etc., which thereafter can be cut into wafers, disks, etc., rather than pressing each wafer, disk, etc., individually. It has been found that wafers produced using the compounds of this invention retain their form when subjected to heat treatment with the semiconductor element and exhibit superior thermal shock resistance.

After formation of the solid dopant carrier, it must be impregnated with one or more appropriate dopants and/or other additives for utilization therewith. Any suitable means of impregnation can be utilized with the carrier of this invention including applying molten dopant, powdered dopant, solutions, suspensions, sputtering, molecular beam, vapors and the like.

A preferred means involves the heating of the carrier with a solution or suspension of the dopant material in organic or aqueous solvent. Generally, the concentration of the solution or suspension is selected to yield a concentration of dopant on the carrier of at least about 10% by weight. After treatment of the carrier with a dopant solution or suspension, the carrier is typically dried by heating.

Multiple dopants can be utilized with the solid carrier of the invention. Typical dopants include compounds containing the elements phosphorus, arsenic, antimony, boron, gallium, aluminum, zinc, indium, and the like.

The thus formed dopant sources are typically ready for use in the vapor deposition process without any further processing steps being required. Typically, wafers of the dopant source are arranged in trays together with wafers of the semiconductor host substrate to be doped and heated to temperatures from about 500° C. to about 1400° C. until appropriate quantities of the active dopant impurities have been deposited on the semiconductor host substrate surface.

The following examples are provided to illustrate the invention and are not meant as a limitation thereof. All temperatures are in degrees centigrade unless otherwise indicated.

EXAMPLE 1

48 grams of metallic silicon, screened through a 50 mesh screen, was dry blended with 32 grams of methyl cellulose (4,000 cp) for 1 hour in a rotary mill at room temperature. The resulting particulate composition was formed into average 2.01 inch diameter, 0.04 inch thick wafers, by pressing into an appropriate die at 4,000 psi. The thus formed wafers were placed on an alumina plate and nitrided by heating to a temperature of 1,400° C. in a 4 inch mullite tube furnace for 39 hours in the presence of a flowing (2 L/min) gaseous nitrogen atmosphere. The resulting wafers were found to be comprised of $Si_3N_4$ and had a diameter of 1.84 inches and a thickness of 0.07 inches. The thus formed wafers, upon visual inspection, appeared to have maintained their structural integrity, did not show deformation such as bending or warping and had a smooth, porous surface.

EXAMPLE 2

60 grams of metallic silicon, screened through a 50 mesh screen, was dry blended with 30 grams of methyl cellulose (4,000 cp) for 1 hour on a rotary mill at room temperature. The resulting particulate composition was formed into average 2.01 inch diameter, 0.08 inch thick wafers by pressing the material into an appropriate die at 4,000 psi. The formed wafers were placed on an alumina plate and nitrided by heating to a temperature of 1,400° C. in a 4 inch mullite furnace for 39 hours in the presence of a flowing (2L/min) nitrogen gas atmosphere. The resulting wafers were found to be comprised of $Si_3N_4$, had a diameter of 1.95 inches and a thickness of 0.08 inches. The thus formed wafers upon visual inspection appeared to have maintained their structural integrity, did not show deformation such as bending or swelling and had a smooth, porous surface.

EXAMPLE 3

A foamed polyurethane wafer, 3.0 inches in diameter and 0.1 inch in thickness was impregnated using the process of copending application 81010A/203D by immersion in a silicon slip containing 60 grams metallic silicon, 39 grams deionized water, 0.5 grams of ammonium alginate, 0.3 grams of styrene malaic anhydride copolymer and 0.2 grams of ammonium carboxylate. The impregnated wafer was hand squeezed to remove excess fluids and was measured, showing a diameter of 3.2 inches and a thickness of 0.106 inches. The thus treated wafer was placed on an alumina plate and nitrided, by heating, to a temperature of 1,400° C. in a 4 inch mullite furnace for 1.5 hours, then at 1450° C. for 12 hours in the presence of flowing (2L/min) gaseous nitrogen atmosphere. The thus formed wafers were found to be comprised of $Si_3N_4$ and had substantially retained the structural porosity of the foamed polyurethane, though the polyurethane had essentially decomposed. The dimension of the wafers were taken and were found to be an average 3.2 inches in diameter and 0.123 inches thick. The wafers did not show deformation such as bending or warping and had a porous surface.

EXAMPLE 4

187.5 grams of metallic silicon, screened through a 50 mesh screen, was blended for one hour on a rotary mill at room temperature, with 62.5 grams of Cere-Amic (gelatinized corn flour), 9.0 grams of dextrine and 15.0 grams of deionized water. The thus blended particulate material was formed into a wafer by pressing into a 3.1 inch diameter billet mold, at 3.0 psi. The thus formed billet was heated slowly to 900° C. and held at that temperature for 12 hours in the presence of nitrogen gas atmosphere. The treated billet was then placed in a 6 inch graphite tube furnace on a graphite setter and nitrided at 1400° C. for 37 hours in the presence of a flowing (30 Std $Ft^3$/hn) gaseous nitrogen atmosphere. The thus nitrided billet was then sliced with a diamond cutting shear to form wafers 60 mil in thickness. The wafers displayed good mechanical integrity.

EXAMPLE 5

170 grams of metallic silicon, screened through a 100 mesh screen, was blended for one hour on a rotary mill at room temperature, with 30 grams of Cere-Amic, 7.5 grams of dextrine and 15.0 grams of deionized water. The thus blended particulate material was formed into a wafer by pressing into a 3.1 inch diameter billet mold, at 3.0 psi. The thus formed billet was heated slowly to 900° C. and held at that temperature for 12 hours in the presence of nitrogen gas atmosphere. The treated billet was then placed in a muffle tube furnace on a graphite setter and heat treated in an Argon atmosphere to 1200° C. for 3 hours, then heated at 1450° C. for 24 hours in the presence of a gaseous nitrogen atmosphere. The billet increased in weight 44% and was found to have a bulk density of 1.35 gm/cc. The porosity of the billet was determined to be 60%. The thus nitrided billet was then sliced with a diamond cutting shear to form wafers 60 mil in thickness.

EXAMPLE 6

$Si_3N_4$ wafers, produced by the method of Example 5 are sprayed, at room temperature, with an aqueous dopant suspension comprising 100 parts $SiP_2O_7$, 122 parts de-ionized water, 1.5 parts ammonium alginate, 1.0 parts of styrene malaic anhydride copolymer and 0.7 parts of ammonium carboxylate, the amount of dopant sprayed on is an amount sufficient to effect a 50% weight add-on calculated after drying for 1 hour at 100° C. The dried dopant containing wafer is thereafter fired at 1,000° C., in air, for 30 minutes to sinter the dopant containing source wafer.

The aforesaid prepared dopant source wafer is heated in a diffusion furnace with a single crystal silicon host substrate semi-conductor element for 60 minutes at 1,000° C. in a nitrogen atmosphere. The resultant phosphorus doped semiconductor element is etched with a 10% aqueous hydrofluoric acid solution and tested in accord with ASTM F43-78 to determine sheet resistivity. ASTM F43-78 defines a four point probe technique for ascertaining the ratio of potential gradient parallel to the current in the material to the current density. The element is confirmed to have a uniform n-type region and found to have a sheet resistivity of 3.68±10% ohms/square. The used phosphorus containing dopant wafer does not show deformation such as bending or swelling and retains its porous surface.

EXAMPLE 7

In a similar manner to Example 6, dopant source wafers are prepared by spraying with an aqueous suspension comprising 100 parts $AlAsO_4$, 122 parts de-ionized water, 1.5 parts ammonium alginate, 1.0 parts of styrene malaic anhydride copolymer and 0.7 parts ammonium carboxylate, to a dry weight add-on of 50% calculated after drying for 1 hour at 1,000° C. The dried dopant containing wafer is fired at 1,000° C., in air, for 30 minutes.

A single crystal silicon host substrate semiconductor element, which has been heated at 1,000° C. for 120 minutes with the dopant wafer, etched with 10% hydrofluoric acid and tested in accord with ASTM F43-78 is found to have a sheet resistivity of 44±10% ohms/square and have a uniform n-type region. The used arsenic containing dopant wafer does not show deformation such as bending or swelling and retains its porous surface.

We claim:

1. The method of forming a vapor deposition dopant source comprising providing a dopant carrier comprised of reaction sintered $Si_3N_4$ and up to about 70% elemental Si, wherein the compound is formed by heating a wafer-shaped body comprising particulate elemental silicon and a binder to a sintering temperature between about 1000° and 1800° C. in a nitrogen atmosphere, said dopant carriers structurally characterized by a solid, porous refractory matrix having interparticulate $Si_3N_4$ bonding, and applying to the dopant carrier a dopant containing an element selected from the group consisting of phosphorous, arsenic, antimony, boron, gallium, aluminum, zinc, silicon, tellurium, tin and cadmium.

2. The method of claim 1 wherein said dopant is present in the pores of said porous refractory matrix.

* * * * *